US005374124A

United States Patent [19]

Edwards

[11] Patent Number: 5,374,124

[45] Date of Patent: Dec. 20, 1994

[54] MULTI-COMPOUND ISOBARIK LOUDSPEAKER SYSTEM

[75] Inventor: Michael S. Edwards, San Jose, Calif.

[73] Assignee: Cass Audio, Inc., San Jose, Calif.

[21] Appl. No.: 43,826

[22] Filed: Apr. 6, 1993

[51] Int. Cl.[5] ........................ H04R 25/00; H05K 5/00

[52] U.S. Cl. ........................................ 381/90; 381/88; 381/89; 381/188; 181/145; 181/147

[58] Field of Search ................ 381/182, 188, 152, 89, 381/88, 90; 181/144, 145, 160, 171, 147

[56] References Cited

PUBLICATIONS

"Audio Cyclopedia", Howard M. Tremaine, 1969, p. 1156.

*Primary Examiner*—Curtis Kuntz
*Assistant Examiner*—Sinh Tran
*Attorney, Agent, or Firm*—Steven F. Caserza

[57] ABSTRACT

A loudspeaker system overcomes disadvantages of prior art systems. To adjust for undesirable room acoustics, high frequency slope compensation is provided which reaches its plateau well beyond the highest audible frequency, providing a more accurate audio reproduction. Electronic filtering increases the high frequency components beyond the audible range, to drive a single set of high frequency acoustical drivers to properly compensate for high frequency attenuation due to room acoustics. Alternatively, a dedicated high frequency acoustical driver provides the high frequency emphasis to compensate for room acoustics, with another set of high frequency acoustical drivers accurately reproducing the audio signal. A multi-compound Isobarik system is also taught, one embodiment utilizing a single internal baffle within a loudspeaker enclosure to allow acoustical drivers operating within similar frequency ranges to be physically located anywhere within the enclosure without limitation due to internal air pressure variations. Acoustical drivers of similar frequency ranges may be physically located at opposite ends of the loudspeaker system enclosure, making the speaker system less sensitive to room acoustics. Enclosure resonance significantly reduced by the use of cylindrical prisms as inexpensive structural elements. In one embodiment, a loudspeaker enclosure is formed of a plurality of subenclosures, allowing a loudspeaker system to be constructed of a plurality of simple elements. In one embodiment, each subenclosure has similar characteristics and is suitable as a loudspeaker system. Alternatively, various subenclosure types have different characteristics so various subenclosures of various characteristics are assembled to form a loudspeaker system of desired acoustical characteristics.

16 Claims, 7 Drawing Sheets

MULTI-COMPOUND ISOBARIK LOUDSPEAKER SYSTEM

BACKGROUND OF THE INVENTION

This invention pertains to loudspeaker systems which are particularly well suited for use in very high fidelity audio systems. More specifically, this invention pertains to loudspeaker systems which have very low distortion and which very accurately compensate for deviations in the acoustics of the room in which the loudspeakers are placed.

DESCRIPTION OF THE PRIOR ART

Audio loudspeaker systems are widely known, and range in quality and acoustical performance from extremely poor to rather excellent. It is the extremely high performance loudspeaker system to which this invention is directed. In the prior art, loudspeaker systems compensated for room acoustics in an attempt to provide the listener with an accurate reproduction of sound not only in spite of the physical limitations of the loudspeaker system itself, but also when considering the characteristics of the acoustics of the room in which the loudspeaker system and the listener are located.

One prior art technique used in high quality loudspeaker systems compensated for upper frequency room acoustics by merely boosting the output of a high frequency acoustical driver that reached its plateau well within the upper audible range (for the purposes of this application, the audible range will be considered to be within approximately 20 Hz to 20 KHz). This is depicted in the graph of FIG. 1, in which the curve labeled A is the room acoustical characteristics, curve B is the acoustical output energy characteristics of a typical prior art compensated loudspeaker system, and curve C is the sum of curves A and B, the resultant audio which is heard by the listener.

This prior art approach has the effect of increasing the high frequency drive to the loudspeaker system at higher frequencies, thereby providing some compensation for the greater attenuation of high frequency audible signals by the characteristics of the room acoustics. Of interest, the prior art loudspeaker compensation systems provided the high frequency acoustical energy output compensation beginning at a frequency $f_1$ (typically about 3 KHz to 10 KHz) and reaching an approximately constant maximum value of compensation at a frequency $f_2$ well within the audible range. This prior art compensation boosts the acoustical output of the high frequency acoustical driver in the manner depicted by curve B, which reaches its plateau well within the audible range. The fact that in prior art loudspeaker systems this compensation plateau is reached well within the audible range while the attenuation due to room acoustics continues through the entire audible range results in an inaccurate reproduction of the overall acoustical energy observed by the listener. Thus, when the prior art compensation curve B in FIG. 1 is added to the room acoustic response curve A, summation curve C is irregular and certainly not flat. A major contributing factor to this is that the high frequency driver is designed to operate in its "flat" region well within the audible range. Since the acoustic response of the room is rolling off at some negative slope at the point that the high frequency driver is operating in its "flat" range, the overall response of such a prior art system cannot be flat.

Certain prior art loudspeaker systems utilize a plurality of audio drivers within one enclosure. However, in certain loudspeaker designs, known as Isobarik systems, one of a pair of matching acoustical drivers must be internally mounted and sealed inside the enclosure with no direct access to the outside of the enclosure, with the other driver of the pair being mounted on an outside surface of the enclosure and acoustically and electrically coupled to the first.

Isobarik and other types of loudspeaker designs require drivers to be mounted inside the speaker enclosure in a method that insures no direct physical contact between the driver and any outside surface of the enclosure. An example of a prior art Isobarik design is shown in FIG. 2. Note that in FIG. 2, driver **3*a* faces inward toward the inside of enclosure 6 and has no direct physical contact with any outside surfaces of the enclosure 6. Driver 3*a* contacts only an internal baffle 1 which is connected to hermetically sealed Isobarik chamber 2. Driver 3*b* is mounted on an outer surface of enclosure 6, and is also connected to hermetically sealed Isobarik chamber 2. FIG. 2 also shows additional acoustical drivers 4 and 5, which might be tweeter and mid-range acoustical drivers, respectively, when Isobarik acoustical drivers 3*a*,3*b*** are woofers.

In the prior art, acoustical drivers of similar frequency range are placed close to each other in order to, among other reasons, minimize performance aberrations due to pressure differentials created within the loudspeaker system enclosure. Thus, in the prior art example of FIG. 2, if two acoustical Isobarik driver pairs **3*a*,3*b* were to be included within enclosure 6**, they would be, in accordance with prior art thinking, physically located close together for best performance.

Another factor of importance in designing high quality audio systems is the prevention of speaker enclosures, and various components thereof, from resonating. Such resonance undesirably colors final sound emanated from the speaker system, i.e. in other words provides an output audio acoustical signal which is not as accurate as desired. Prior art high quality loudspeaker systems attempt to reduce the possibility of resonance by utilizing a number of techniques, including providing rather specialized (and thus expensive) loudspeaker system enclosure shapes, rigid internal enclosure bracing, the use of sound damping materials installed inside the speaker enclosure, and the use of very heavy materials for construction of the enclosure.

SUMMARY

In accordance with the teachings of this invention, a novel audio loudspeaker system is provided which overcomes many of the disadvantages of prior art systems. In order to adjust for the undesirable effects of room acoustics, in one embodiment of this invention room acoustics slope compensation is achieved by providing high frequency compensation which reaches its plateau well beyond the highest audible frequency, thereby providing a more accurate audio reproduction compensated for the effects of room acoustics. In one embodiment, electronic filtering is used to properly increase the high frequency components beyond the audible range, to drive a single set of one or more high frequency acoustical drivers properly compensate for high frequency attenuation due to room acoustics. In an alternative embodiment, a dedicated high frequency acoustical driver is used to provide the high frequency emphasis to compensate for the high frequency attenuation of room acoustics, with the remaining set of one or more high frequency acoustical drivers accurately reproducing the desired audio signal.

As another feature of this invention, a multi-compound Isobarik system is taught. One embodiment of a multi-compound Isobarik system of this invention utilizes a single internal baffle within a loudspeaker system enclosure to allow acoustical drivers operating within similar frequency ranges to be physically located anywhere within the loudspeaker enclosure without limitation due to internal air pressure variations. In one embodiment, such acoustical drivers of similar frequency ranges are physically located at opposite ends of the loudspeaker system enclosure, thereby making the speaker system less sensitive to room acoustics.

As another feature of this invention, speaker enclosure resonance is avoided or at least significantly reduced by the use of cylindrical prisms as inexpensive structural elements.

In one embodiment, a loudspeaker enclosure is formed of a plurality of subenclosures, allowing a loudspeaker system to be constructed of a plurality of simple elements and expanded at a later date. In one such embodiment, each subenclosure has similar characteristics and is suitable as a loudspeaker system in and of itself. In another embodiment, various subenclosure types have different characteristics so that various subenclosures of various characteristics can be assembled together to form a loudspeaker system of desired overall acoustical characteristics.

DETAILED DESCRIPTION

In accordance with the teachings of this invention, a loudspeaker system is taught which includes a number of audio drivers, including one or more audio drivers specifically dedicated for the purpose of compensating for the effect of the room acoustics. In one embodiment of this invention, these one or more drivers dedicated for compensation of high frequency room acoustics are driven by a dedicated cross-over circuit. In this embodiment, a high-pass filter is used having a cut-off frequency greater than the desired frequency spectrum within which acoustic correction is desired. This results in an acoustic correction below this cut-off frequency $f_{CO}$ which has continuous slope, rather than reaching a plateau, within the audible frequency spectrum.

Figure 3:
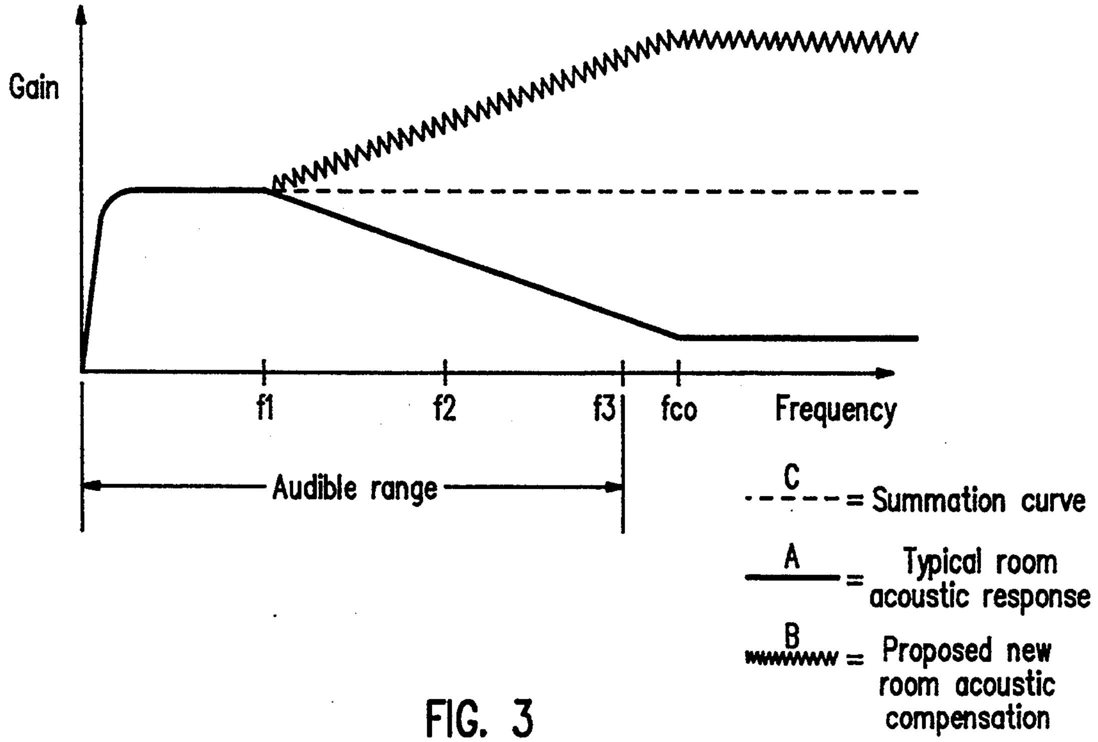
FIG. 3 is a graph depicting typical room acoustical characteristics, room acoustic compensation provided in accordance with this invention, and the resultant summation characteristic of this invention.
Figure 2:
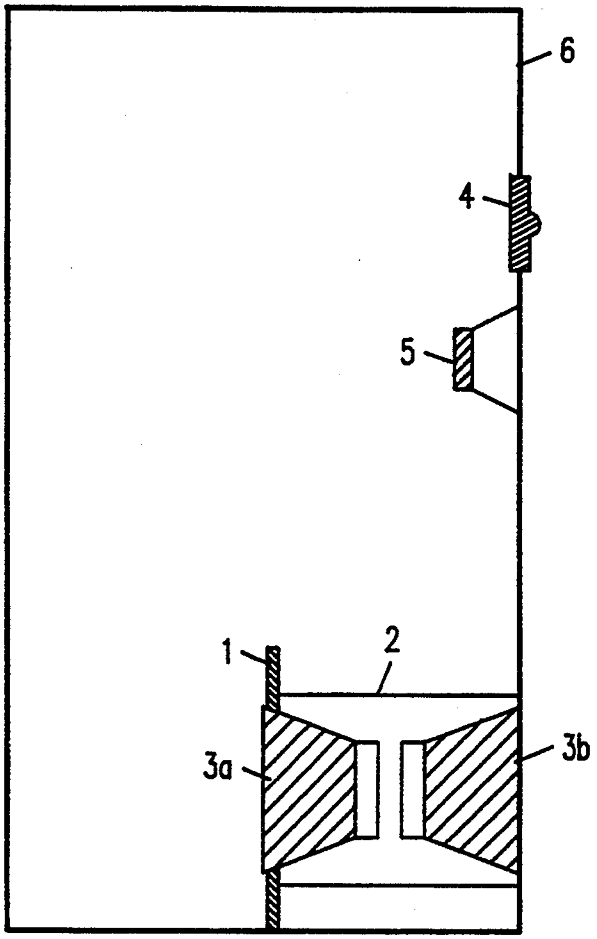
PRIOR ART FIG. 2
FIG. 2 is a cross sectional view of a prior art loudspeaker system including an Isobarik pair of acoustical drivers.

This is shown in FIG. 3, in which curve A depicts the room acoustics, which cuts off well within the audible range. Curve B shows the high frequency correction provided in accordance with the teachings of this invention, which increases in gain at approximately the point (frequency $f_1$) at which room acoustics begin attenuation of high frequency audio components, and continues to increase in gain beyond the highest audible frequency $f_3$ and up to cut-off frequency $f_{CO}$, at which point a plateau is reached. Curve C in FIG. 3 depicts the resulting acoustical signal delivered to the listener by the combined effects of the speaker system of this invention and room acoustics, which is substantially flat, as desired, across the entire audible range up to at least the maximum audible frequency $f_3$, in spite of the effects of the room acoustics depicted by curve A.

Electronic filtering networks suitable for providing the high frequency emphasis shown by curve B are well known in the art, but heretofore in speaker systems such high frequency emphasis has not been used to provide compensation up to and beyond the highest audible frequency. The prior art also did not use a dedicated driver to provide this high frequency compensation. The use of a dedicated driver for this purpose simplifies the design of the loudspeaker system and reduces cost over the next described embodiment in which one or more high frequency drivers are used for the purpose of providing high frequency acoustical energy output including a substantially constant response slope throughout and beyond the highest audible frequency for compensating for the inherent high frequency attenuation of the room acoustics.

Figure 1:
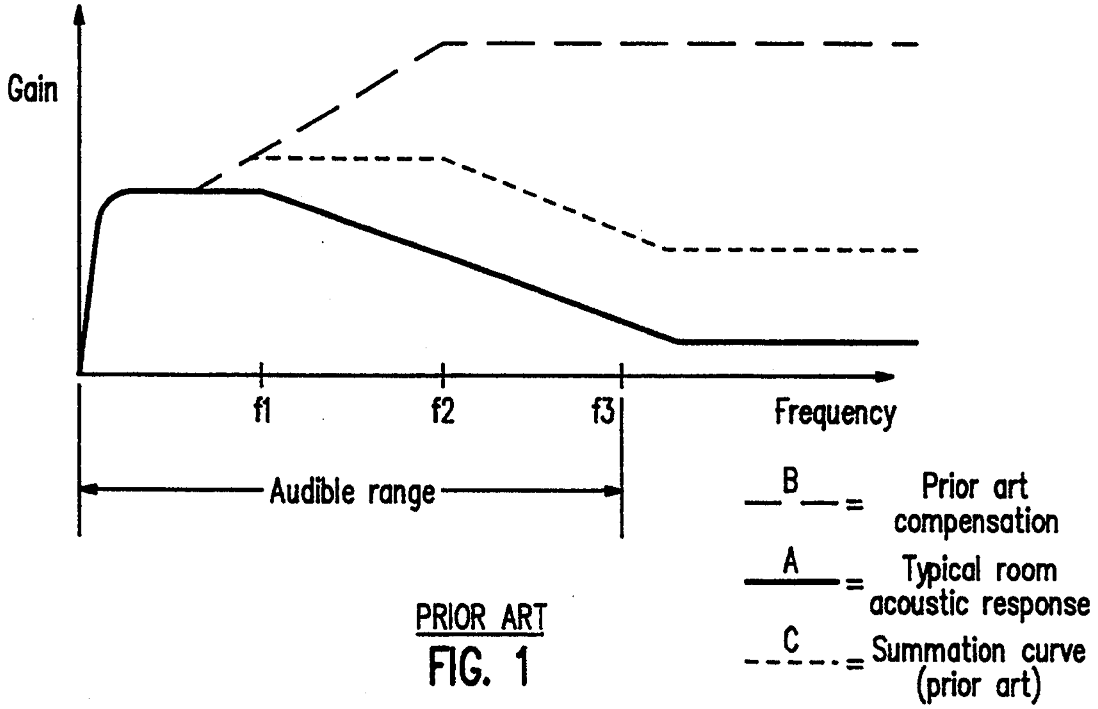
PRIOR ART FIG. 1
FIG. 1 is a graph depicting typical room acoustical characteristics, prior art room acoustic compensation, and the resultant summation characteristic.

Prior art systems attempt to compensate for room acoustics by merely boosting the entire range within which high frequency driver operates. Curve C of FIG. 1 demonstrates that the summation that occurs in previous art methodology does not produce a flat response. This is due to the fact that when the high frequency driver reaches its plateau at frequency $f_2$ within the audible range, the room acoustic response shown in curve A is still rolling off in a negative direction. Therefore, when a slope of zero (curve B above frequency $f_2$) is added to the negative slope of curve A, the summation shown in curve C is a negative slope. Traditional thinking in the prior art of loudspeaker filter design is to merely add together the slopes at the crossover point of various driver circuits in an attempt to obtain the desired response. In contrast, the present invention adds a specific positive slope from frequency $f_1$ to beyond the highest audible frequency $f_3$, for the purpose of causing the acoustical energy emanating from the loudspeaker system to have a response that is not flat, in order to compensate for a room acoustic environment that de-emphasizes high frequency components at a given slope.

The exact nature of the emphasis provided is best determined once the loudspeaker system enclosure and acoustical drivers have been selected and assembled in order to take advantage of their own natural frequency response and, if the ultimate in performance is desired, will take into consideration the specific room acoustics of the actual room in which the loudspeaker system is to be utilized. However, excellent results are obtained by assuming that the loudspeaker system will be used in a "typical room" in which case minor variations may occur in actual use depending on the actual room acoustics. In this event, if desired, the filter network can be altered for fine tuning the final environment. In one embodiment of this invention, such adjustment is easily provided by constructing the filter network with appropriate adjustments.

Thus, in contrast to prior art loudspeaker system designs in which cross-over networks are used to feed appropriate electrical signals of appropriate frequencies to the various acoustical drivers in the loudspeaker system for the purpose of maintaining a flat acoustical energy magnitude response as measured at 1 meter in an anechoic chamber, the teachings of this invention result in the use of a dedicated driver or driver array to produce an emphasized high frequency response which appropriately compensates for the apparent de-emphasis provided by room acoustic faults. A dedicated driver or dedicated driver array is used in this embodiment for high frequency emphasis to compensate for room acoustics so that a loudspeaker system of this embodiment will produce a flat uncompensated output in a listening room that does not require high frequency listening room compensation, and so that the dedicated driver can be easily adjusted to provide any desired amount of listening room compensation, in a simple and cost effective manner. The net result is the listener will perceive the combination of emphasized high frequency signals emanated from a loudspeaker system and the de-emphasis inherently provided by the room acoustics as a combined flat audio response even at high frequencies, thereby providing the most precise audio signals to the listener.

Figure 4:
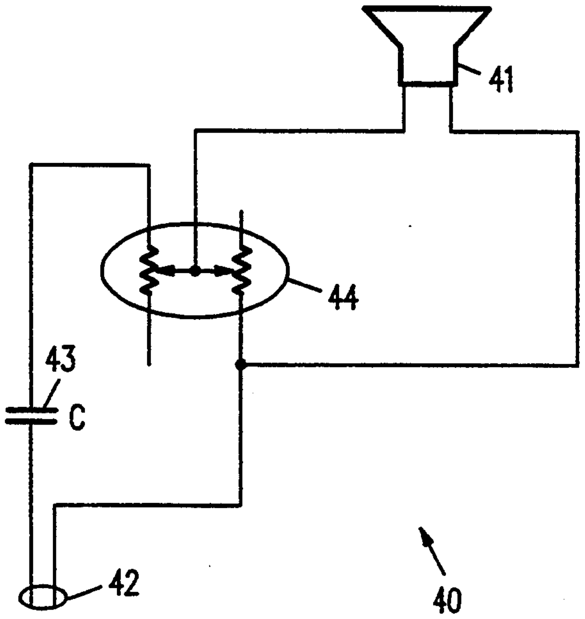
FIG. 4 is a schematic representation of a high frequency slope compensation network suitable for use in accordance with this invention when a dedicated acoustical driver is used for room acoustic compensation.

FIG. 4 is a simple example of one embodiment of a high frequency slope compensation system 40 constructed in accordance with the teachings of this invention. Slope compensation system 40 includes dedicated acoustical driver 41 which may comprise, for example, an 8 ohm tweeter and in one embodiment is a ribbon driver such as the model number RBT100 available from M.G. Electronics of New York. Input port 42 receives an electrical signal of the audio to be reproduced by the loudspeaker system of which high frequency compensation system 40 forms a part. The input signal present at port 42 is an unfiltered signal containing the full audio bandwidth. An RLC network formed of L-Pad 44, capacitor 43, and driver 41 serves as a single-pole filter to provide the desired cut-off frequency $f_{CO}$ at a constant impedance. In one embodiment, capacitor 43 has a capacitance of approximately 1 microfarad and the combination of L-Pad 44 and driver 41 have a constant impedance of approximately 8 ohms. If desired, more sophisticated cross-over networks can be used, including active networks utilizing operational amplifiers or the like. The importance is, however, that the cut-off frequency $f_{CO}$ is above the highest audible frequency so that the high frequency emphasis does not plateau within the audible range, as depicted in curve B in the graph of FIG. 3.

Figure 5:
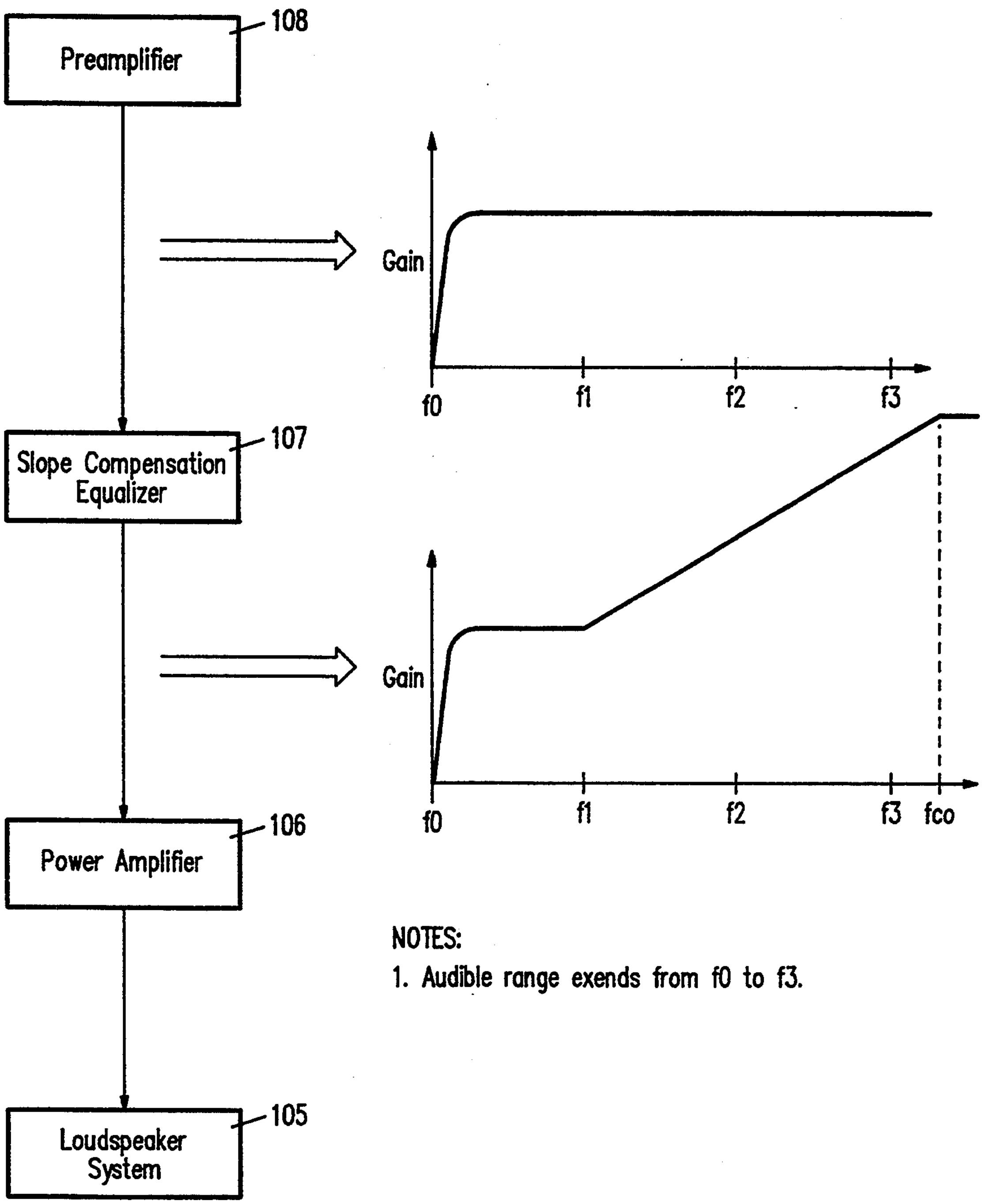
FIG. 5 is block diagram depicting an alternative embodiment of this invention in which room acoustic compensation is provided without the use of an acoustical driver dedicated to this purpose.

In an alternative embodiment, room compensation is provided in a loudspeaker system without the use of a dedicated high frequency acoustical driver for this purpose. In this embodiment, a high frequency acoustical driver or driver array 105 is used to receive from power amplifier 106 driven by active equalization circuit 107 an electrical signal including the high frequency emphasis needed to compensate for room acoustics. In this embodiment, the active equalization circuit 107 provides continuous compensation slope (either positive or negative, depending on the nature of room acoustics to be compensated) from a first audible frequency through a second audible frequency greater than the upper limit of the audible frequency range. As shown in FIG. 5, the frequency response of the signal from preamplifier 108 is substantially flat across the entire audible frequency range ($f_0$ through $f_3$), while the frequency response of the signal provided by equalizer 107, and thus the electrical drive provided by power amplifier 106 to loudspeaker system 105, is emphasized in the range from $f_1$ through $f_{CO}$, beyond this highest audible frequency $f_3$.

Figure 6:
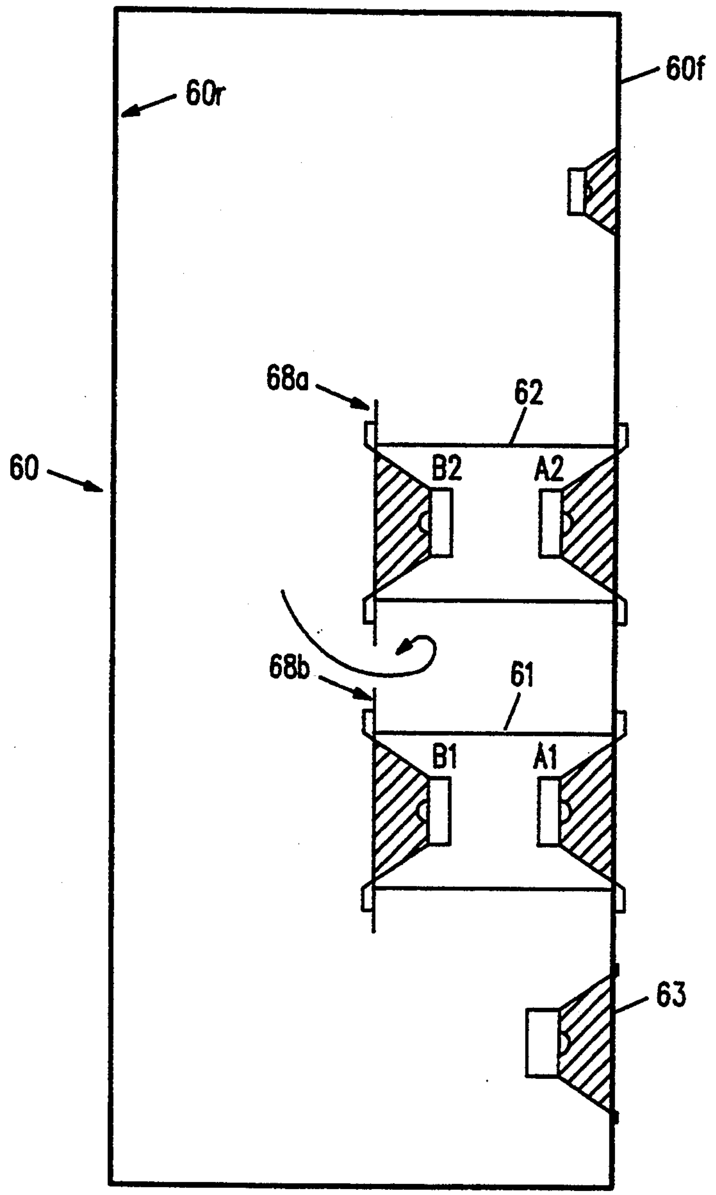
FIG. 6 is a cross sectional view of one embodiment of a multi-compound Isobarik loudspeaker system constructed in accordance with this invention.

In accordance with another feature of this invention, a multi-compound Isobarik loudspeaker design is taught in which more than one of the above described Isobarik pairs of acoustical drivers are used. In one embodiment, as shown in FIG. 6, the internally mounted acoustical drivers B1 and B2 are mounted inside loudspeaker enclosure 60 each on its own dedicated internal baffle **68*b* and 68*a***, respectively, in which each baffle serves the purpose of providing a secure and rigid mounting structure.

In one embodiment, the separate internal baffle design is ported (i.e. by the use of a hole in the loudspeaker enclosure to allow air flow to the room, or the use of a passive radiator), allowing the port to be tuned by designing the diameter and length of the hole serving as the port, or by adding or subtracting mass from the passive radiator 63.

Figure 6A:
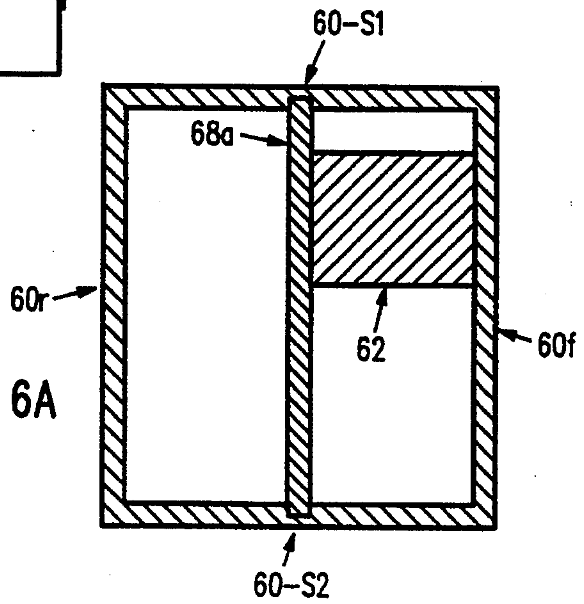
FIG. 6A is a top view of the embodiment of FIG. 6, with the top cover removed for internal observation.

Thus, in accordance with the teachings of this invention, a multi-compound Isobarik loudspeaker is taught allowing greater acoustical energy output. Furthermore, for a given acoustical energy output, cone excursion of each acoustical driver is reduced with a resultant decrease in distortion. Also, since less electrical power is applied to each voice coil within the acoustical drivers for a given acoustical energy output as compared with a prior art Isobarik loudspeaker system, a lower resonant frequency results allowing for a more extended low frequency performance. When an internal multi-baffle design is used in accordance with the teachings of this invention, each baffle serves as an effective horizontal brace by inserting each baffle into grooves cut into one or more of the interior walls of the loudspeaker enclosure, or by attaching the baffles to one or more of the interior walls of the loudspeaker enclosure with appropriate braces. The use of grooves in interior walls of the loudspeaker enclosure for placement of interior baffles is depicted in the top view (with top removed) of FIG. 6A.

As another feature of this invention, a loudspeaker system is taught including a plurality of Isobarik pairs and a single internal baffle for internally mounting one acoustical driver of each Isobarik pair. The use of a single internal baffle in accordance with the teachings of this invention allows the speaker designer to take advantage of acoustical driver separation for the purpose of making the speaker system less sensitive to room acoustics. Acoustical drivers of similar frequency range can be physically separated within the loudspeaker enclosure without limitation since air pressure tends to remain constant throughout the various parts of the loudspeaker enclosure due to the use of only a single internal baffle as taught by this invention.

When mounting multiple internal drivers inside a loudspeaker enclosure, the rigid, separate baffle structures can cause wind noise and resonances to occur. As can be seen from FIG. 6, the air currents created within enclosure C can cause wind noises as the air is forced over the openings of various cavities (such as cavity 41) created by the multi-baffle approach.

Figure 7:
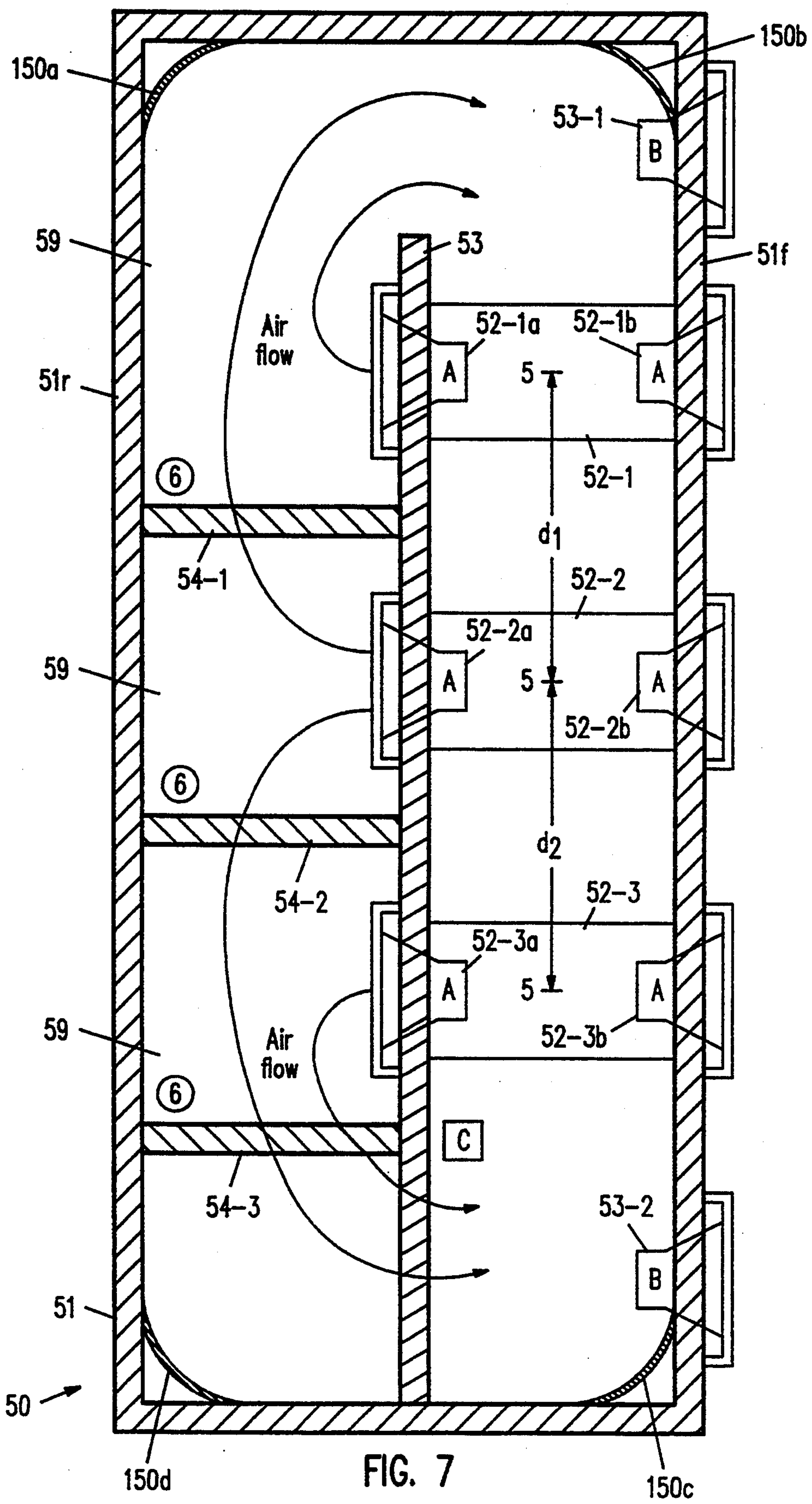
FIG. 7 is a cross sectional view of one embodiment of a multi-compound Isobarik loudspeaker system constructed in accordance with an alternative embodiment of this invention.

In this alternative embodiment of FIG. 7, the Hemholtz effect related to cavity 41 of the embodiment of FIG. 6 is avoided by using a single internal baffle 53 to which all internally mounted acoustical drivers are attached, thus avoiding the creation of various cavities such as cavity 41 of FIG. 6. Further, the embodiment of FIG. 7 reduces air pressure differentials within the loudspeaker system enclosure as compared with the embodiment of FIG. 6, since in the embodiment of FIG. 6 drivers B1 and B2 are each mounted on their own dedicated baffle in which restriction F is not equal to restriction G. This results in the excursion of passive radiator PR2 being greater than the excursion of passive radiator PR1, resulting in some distortion in the reproduced acoustical signal, especially if the excursion limit of one of the passive radiators is reached.

Figure 8:
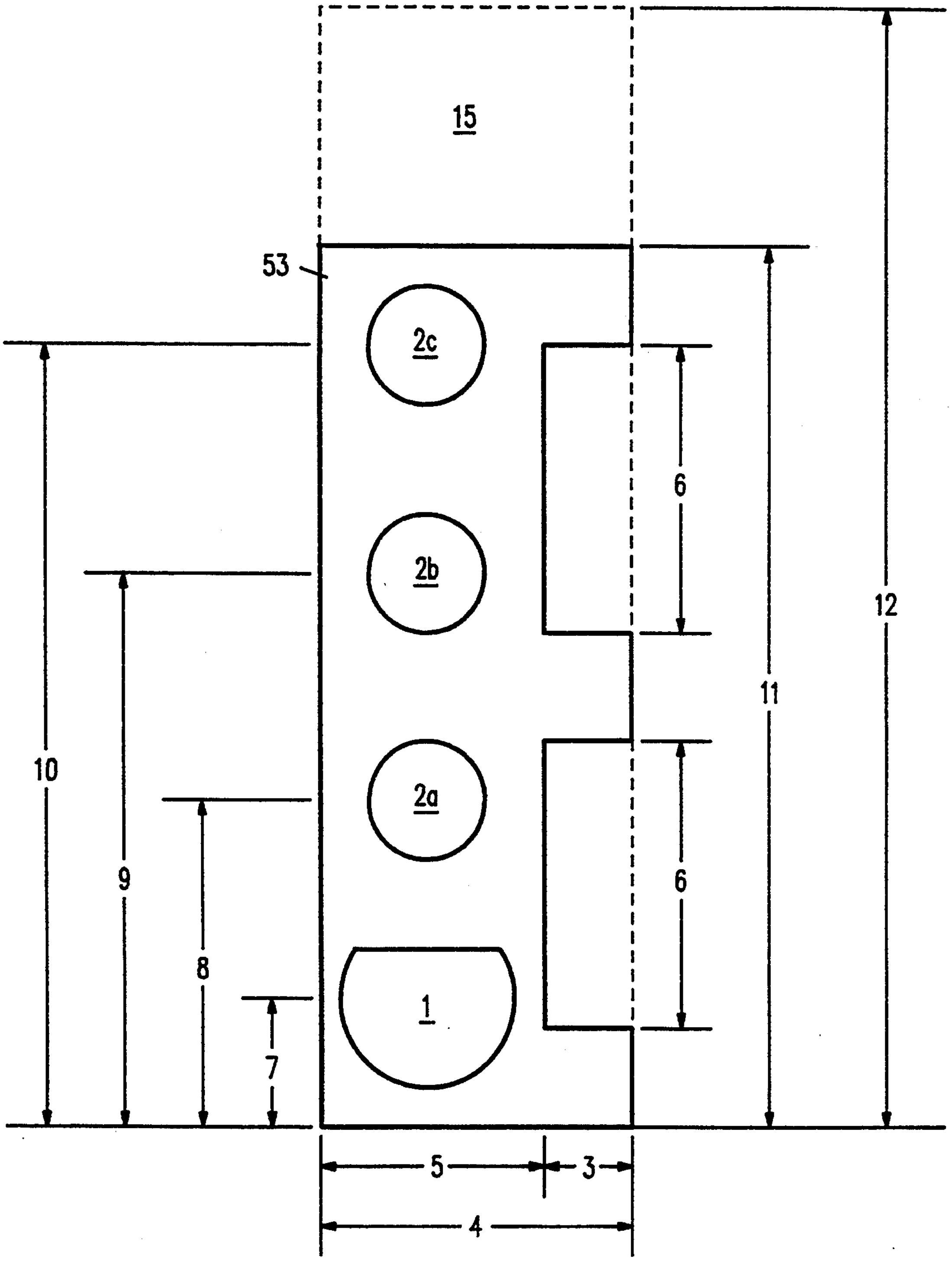
FIG. 8 is a plan view of one embodiment of internal baffle 53 of the embodiment of FIG. 7.

The embodiment of FIG. 7, as compared with the embodiment of FIG. 6, eliminates various chambers within the loudspeaker enclosure, and thus wind noise is reduced. The various air passages within loudspeaker enclosure 51 can easily be made equal or of any desired effective cross sectional area by adjusting the length and/or width of internal baffle 53. Also, as shown in FIG. 7, a single continuous chamber 59 is created. By altering the cross sectional area of chamber 59, the system can be tuned to permit passive radiators 53-1 and 53-2 to each contribute more or less acoustical energy output. This has the effect of altering the compliance of the passive radiator as well as loading acoustical driver pairs 52-1*a,b*; 52-2*a,b*; and 52-3*a,b* to effectively produce the desired loudspeaker system alignments. In certain embodiments, holes such as hole 1 of FIG. 8 are formed in baffle 53 in order to control the acoustic output energy of a port, which port may be formed as a hole in the loudspeaker enclosure or a passive radiator. Further, by selecting the appropriate length and cross-sectional area, chamber 59 can be tuned to a desired frequency $f_6$, to be used in conjunction with traditional tuning methods associated with vented designs including mass loading of passive radiators. An additional benefit of this single internal baffle design taught by this invention is that internal baffle 53 can be connected to the two sides of loudspeaker enclosure 51 so that baffle 53 performs the additional function of acting as an internal brace. This provides an inexpensive and extremely effective method of internal cabinet bracing.

FIG. 7 shows a cross-sectional view of one embodiment of this invention showing the use of a single internal baffle 53 and the use of sealed, tuned chambers 52-1 through 52-3 mounted between internal baffle 53 and speaker enclosure front face 51*f*. Preferably, sealed, tuned chambers 52-1 through 52-3 comprise cylindrical prisms, as will be discussed more fully later. Internal baffle 53 is preferably formed so as not to run the entire width (i.e. in a plane perpendicular to the plane of FIG. 7) of enclosure 51, thereby allowing free airflow around the sides of internal baffle 53. In operation, loudspeaker system 50 receives an electrical input signal for electrically powering speakers 52-1*a,b*, 52-2*a,b* and 52-3,*a,b* located within cylindrical prisms 52-1, 52-2, and 52-3, respectively. Speakers 53-1 and 53-2 are passive radiators, driven by air pressure produced by the action of electrically powered drivers 52-1*a,b* through 52-3*a,b*. In accordance with the teachings of this invention, the use of a single internal baffle 53 allows air pressure to be more easily and uniformly maintained throughout the loudspeaker enclosure as compared with the previous embodiment systems in which a plurality of internal baffles are used and in which a plurality of additional undesired chambers are created, each with its own resonant frequency and each capable of acting as a Hemholtz resonator adding unwanted sound coloration.

Shown in FIG. 7 are internal baffle braces 54-1 through 54-3 placed between internal baffle 53 and rear enclosure face 51. However, braces 54-1 through 54-3 preferably do not run the entire width (i.e. in the plane perpendicular to the plane of FIG. 7) thereby allowing unrestricted air flow throughout enclosure 51. Similarly, internal baffle 53 does not run the entire width of loudspeaker enclosure 51 throughout its entire length (as shown in FIG. 7, permitting excellent air flow and substantially constant pressure throughout loudspeaker enclosure 51. In one embodiment of this invention, holes are provided in one or both of internal baffle 53 and internal baffle braces 54-1 through 54-3 to ensure unrestricted air flow between the front and rear portions of enclosure 51. Because of the novel design of enclosure 51, air pressure is maintained substantially equally throughout. This equal air pressure allows the various drivers 52-1*a,b* through 52-3*a,b*, 53-1, and 53-2, operating in the same frequency bandwidth to share the load equally. With all of these drivers sharing the load equally, the ratio of mechanical acoustical output energy to electrical input energy of each driver tends to remain constant among the various drivers. This provides the following advantages, each of which reduces distortion, increases efficiency, and increases power handling capability. First, driver excursion, the physical distance that the cone of a driver moves is held constant between identical drivers operating in the same frequency bandwidth. Secondly, the air pressure against all driver cones tends to be held rather constant among drivers. Furthermore, the tendency for a cone in a given driver to break up into the various resonance modes is reduced as compared with prior art designs. Since the air pressure against the driver cones tends to be held rather constant among the drivers, the drivers tend to share the load more equally. This tends to prevent, especially in the piston range of the driver, one driver excursion from being significantly more than that of another driver. In an operating range, if one driver reaches its maximum excursion for linear operation ($X_{max}$) before the other driver operating within this frequency range do, this one driver will begin to produce distortion. If this driver reaches its maximum nonlinear excursion before the other drivers, premature cone breakup will occur in this single driver causing distortion, or perhaps even physical damage to the driver. If air pressure is held constant, all identical drivers operating in the same frequency range tend to share the load equally resulting in a more accurate sound stage and significantly higher power handling capacity.

With respect to passive radiators 53-1 and 53-2, since equal air pressure is easily maintained throughout loudspeaker system 50 in accordance with the teachings of this invention, the various passive radiators such as radiators 53-1 and 53-2 of the embodiment of FIG. 7 can be mounted anywhere on loudspeaker enclosure 51, including the front, rear, side and top surfaces. It can also be mounted on the bottom surface, if feet or mounting devices (not shown) are used so that the base of loudspeaker enclosure 51 is not resting on the floor. Furthermore, the placement of various passive radiators away from each other, particularly for low frequency drivers, helps to avoid the undesirable low frequency cancellation which is otherwise caused when a low frequency driver is placed too close to a reflecting surface within the room. If a low frequency driver, either active or passive radiator, is placed at an extreme end of a speaker system enclosure (i.e. bottom), the sound energy that reflects off of the closest surface (i.e. floor) can cause cancellation of the sound energy directly radiating from the driver. With the single internal baffle design, since the air pressure throughout the speaker system enclosure tends to be held more constant, an addition driver or passive radiator can be placed at another location within the enclosure, even at the extreme opposite end of the enclosure. Therefore, if the output of one driver is canceled out at a certain frequency, the output of the driver in the opposite enclosure location is not canceled out. This approach makes the speaker system significantly less sensitive to listening room acoustic faults. Thus, in accordance with the teachings of this invention, in embodiments where low frequency drivers are widely separated within enclosure 51, low frequency performance is significantly less sensitive to listening room acoustic faults as compared with both prior art systems.

While the embodiment of FIG. 7 shows the use of single internal baffle 53 in conjunction with relatively low frequency drivers, it can also be applied in accordance with the teachings of this invention to make high frequency drivers as well. The single internal baffle as taught by this invention can be used in a wide variety of applications, without regard to the one or more frequency ranges of the one or more Isobarik pairs of acoustical drivers.

A multi-compound Isobarik design including the use of a single internal baffle 53, as taught by this invention, also significantly reduces cost and simplifies the manufacturing process as compared with prior art designs in which much more complex structures are used in an attempt to minimize distortion and to place the drivers at appropriate locations given the limitations of such prior art designs. Furthermore, in accordance with the teachings of this invention, the specific geometry of internal baffle 53 and cut-outs within internal baffle 53 are designed to help load the drivers and tune the enclosure.

Referring again to FIG. 7, in accordance with the teachings of this invention, sealed, tuned chambers 52-1 through 52-3 used to house electrically driven drivers 52-1*a,b* through 52-3*a,b* are preferably formed as cylindrical prisms. In accordance with the teachings of this invention, rather than relying on the sheer strength of internal braces 52-1 through 52-3, the shape of these internal braces are of key importance. When cylindrical prisms are used as internal braces 52-1 through 52-3 in accordance with the teachings of this invention, the effect is to minimize or eliminate the resonances which might otherwise occur due to the symmetrical shape of the inside of a rectangular enclosure. When rigid cylindrical prisms preferably having a diameter of at least about 40 percent of the shortest internal dimension of the prism are used as braces, the constantly varying geometry of cylinder surface breaks up resonances that would otherwise occur. Further, it is preferred that the prism volume is at least 10% of the enclosure volume. The use of a cylindrical prism as braces 52-1 through 52-3 allows for inexpensive construction in order to substantially minimize or eliminate resonances, without the added expense of extremely complex, uniquely shaped enclosures which have been used in the prior art as internal braces 52-1 through 52-3.

FIG. 8 is a view of one embodiment of internal baffle 53, showing dimensional indicia. The following table specifies dimensions of one exemplary embodiment of internal baffle 53, with dimensions measured from the internal surface of the loudspeaker enclosure.

TABLE 1

| | |
|---|---|
| Hole 1 | 13.875 inches in diameter |
| Holes 2a–2c | 11.125 inches in diameter |
| Dimension 3 | 6.5 inches |
| Dimension 4 | 23 inches |
| Dimension 5 | 16.5 inches |
| Dimension 6 | at least 0.1 times Dimension 11, but at least 4 inches (in this embodiment, 28 inches) |
| Dimension 7 | 10.25 inches (the lower passive radiator tuning port) |
| Dimension 8 | 25.25 inches (for a 12 inch internal woofer 52-3a of FIG. 7) |
| Dimension 9 | 41.75 inches (for a 12 inch internal woofer 52-2a of FIG. 7) |
| Dimension 10 | 58.25 inches (for a 12 inch internal woofer 52-1a of FIG. 7) |
| Dimension 11 | 66 inches (this height is used for adjusting the upper passive radiator) |

Dimension 6 specifies areas dedicated for the purpose of providing equal air flow from all three Isobarik compound woofer pairs. Additional air flows over the top of the internal baffle through area 15 to the top mounted passive radiator 53-1 (FIG. 7) and through a tuned cutout 1 (FIG. 8) in the bottom of internal baffle 53 to a second passive radiator 53-2 (FIG. 7) located at the opposite end of the speaker enclosure (i.e. bottom). These passive radiators are located at the opposite ends of the enclosure to compensate for listening room acoustic faults as described previously. This prevents complete cancellation of low frequency energy waves by reflections from room boundaries close to the passive radiators.

Referring again to FIG. 7, when an electrical signal is delivered to electrically powered drivers 52-1*a,b*; 52-2*a,b*; and 52-3*a,b* (12" woofers in one embodiment) they begin to displace air in an amount and at a frequency directly proportional to the magnitude and frequency of the electrical signal. Each sealed, tuned enclosure 51-1 through 51-3 contain a pair of 12" woofers. Each pair consists of one driver facing the listener and another facing the opposite direction (i.e. into loudspeaker enclosure 51). Each of the drivers in the pair is wired 180° out of phase with respect to its mate. When a positive going signal is fed into the pairs of drivers, the driver cones move toward the listener. Conversely, when a negative going signal is fed into the driver pairs, the driver cones move back into the loudspeaker enclosure away from the listener.

When a positive electrical signal is fed to the loudspeaker system and the cones of drivers 52-1*a,b*; 52-2*a,b*; and 52-3*a,b* move forward to the listener, a pressure void is created behind vents (passive radiators in this case) 53-1 and 53-2. The magnitude of vacuum created is directly proportional to three elements:

1. Magnitude of electrical signal;
2. Air flow restriction created by placing internal baffle 53 closer to or farther from the rear enclosure wall 51*r*; and
3. Air flow restriction created by the geometry of the internal baffle itself.

Since all three internally mounted drivers (52-1*a*, 52-2*a* and 52-3*a*) are all mounted on the single internal baffle 53 they become a single loaded driver motor.

As the electrical signal changes polarity and becomes a negative going signal the driver cone A move back into the speaker enclosure, away from the listener. As the driver cones move into the enclosure, a pressure is built up behind vent (passive radiators 53-1 and 53-2 in this exemplary embodiment). Therefore, from inspection, we can see that air is either forced into the listening room, or removed from it by the various drivers and ports. The amount of air that is moved at various frequencies is given by the strength of the electrical signal, the tuning of port B and the tuning of cavity 59 between internal baffle 53 and rear enclosure wall 51*r*. In one embodiment, the frequency at which the port begins to significantly contribute is controlled by adding or subtracting mass from the passive radiators (53-1 and 53-2). The amplitude of their contribution with respect to the powered drivers 53-1*a,b*; 53-2*a,b*; and 53-3*a,b* is controlled by the cross-sectional area and length of cavity 59 between the single internal baffle 53 and rear enclosure wall 51*r* as well as by openings 15 and 1 shown in FIG. 8.

In this embodiment, the cylindrical prism is conveniently and inexpensively constructed of heavy cardboard, hollow tube and provides three important functions. First, the cylindrical prism supports and braces internal baffle 53 with respect to speaker enclosure front face 51*f*. Secondly, as described above, the use of a cylindrical prism tends to break up resonances in speaker enclosure 51. Furthermore, the use of hollow cylinders as cylindrical prisms provides a sealed, constant pressure chamber for connecting associated electrically driven drivers such as drivers 52-1*a* and 52-1*b*. In one embodiment of this invention, the cylindrical braces are 14 inch in diameter and approximately 10.25 inches in length. Preferably, in order to be as effective as possible, the total volume of the cylindrical prisms should be greater than 10% of the total enclosure volume. These cylinders can be semi-cylinders and attached to various surfaces with the enclosure, as shown by semi-cylinders 150*a* through 150*d* in the embodiment of FIG. 7. Again, the constantly changing surface of the semi-cylinder will tend to break up various resonances.

Figure 9A:
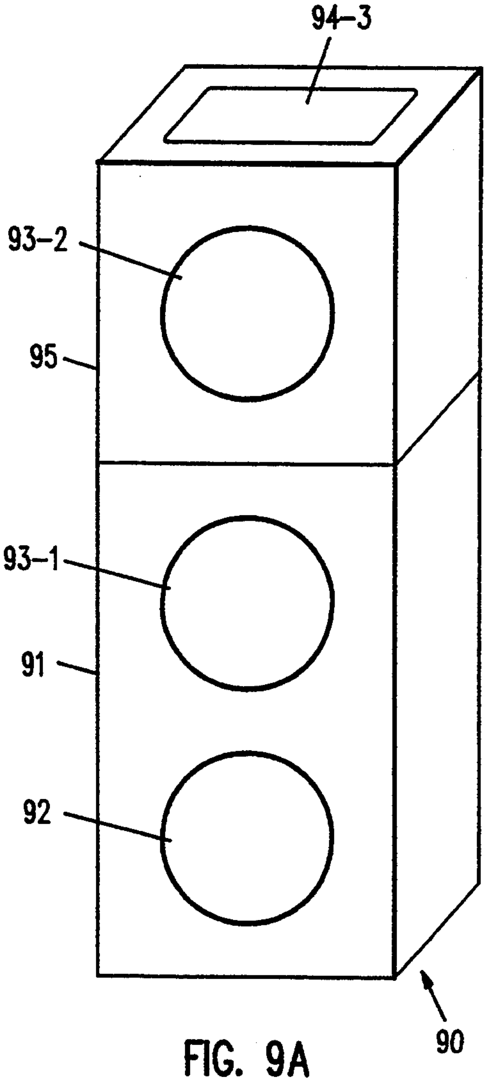
FIG. 9 is a composite drawing of FIGS. 9A and 9B, showing an embodiment of this invention in which a loudspeaker enclosure is formed of a plurality of loudspeaker subenclosures.
Figure 9B:
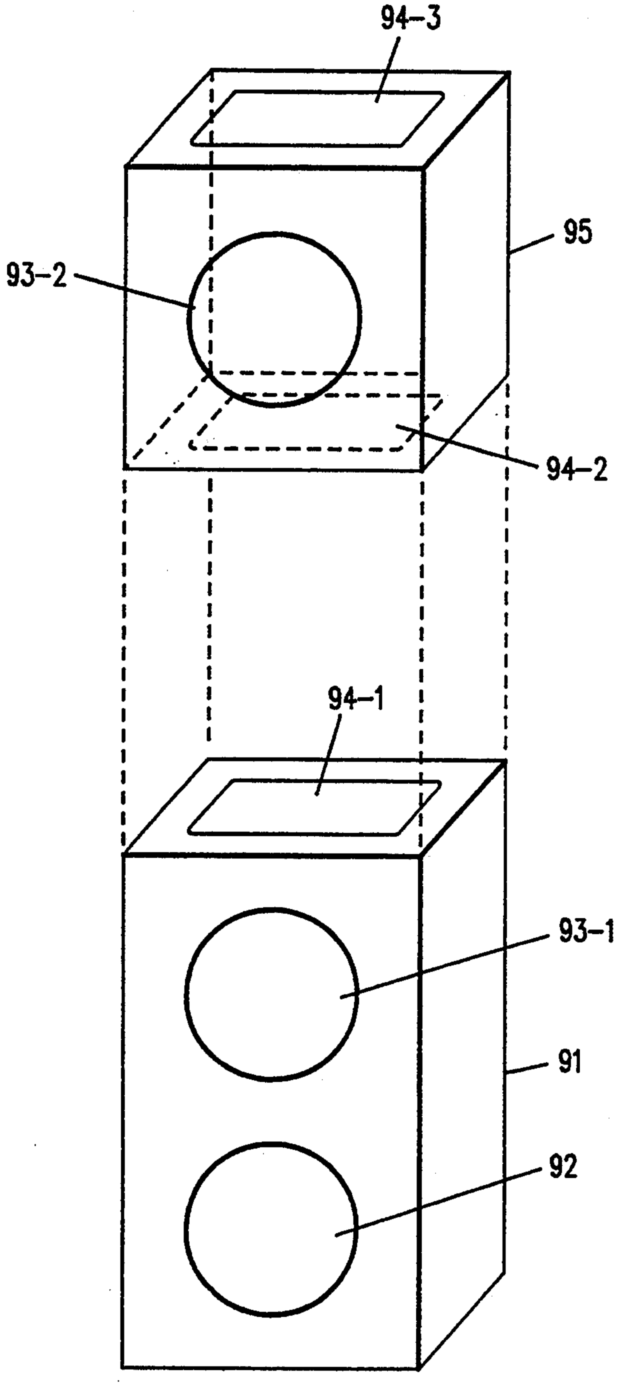

FIG. 9 depicts one embodiment of this invention in which a loudspeaker enclosure 90 (FIG. 9*a*) is constructed of a plurality of loudspeaker subenclosures 91, 95 (FIG. 9*b*). In one embodiment, each loudspeaker subenclosure is constructed to be useful as a loudspeaker system in and of itself, as well as for convenient combining with like or different subenclosures in order to provide a loudspeaker enclosure of any desired size and performance characteristic. The unique characteristic of this embodiment is that when the various subsections are combined a single enclosure is formed since various parts of the enclosure walls, i.e. top and bottom, are removable. For example, an extremely low cost yet high quality loudspeaker system can be used in the home or in a small room which consists of perhaps only one of these subsections per channel. For higher quality and for use in a larger home or in a small commercial area, for example, a loudspeaker system is constructed of two or three subsections. For larger commercial applications, for example, a larger number of subsections are combined together in order to provide a suitable high quality, high power loudspeaker enclosure. In this embodiment, subsections include means for combining a plurality of subsections and providing a substantially sealed air cavity within the combined set of subsections. This is provided, for example, by providing removable portions of the top and/or bottom of each subsection, which removable portions are removed when the subsections are assembled together. Preferably, some sort of gasketing material is used when combining subsections, in order to provide a high quality air seal. By providing each subenclosure to function as a loudspeaker system, a customer can enhance and expand his loudspeaker system by simply adding additional subenclosures, without the need to completely replace his previously used enclosures.

In one embodiment of this invention, various subsection types have various audio characteristics. For example, in accordance with this embodiment, one subsection type might be for extremely low frequencies, another subsection type for mid range frequencies, and yet another subsection for high frequencies. Alternatively, one subsection type includes an active woofer and a passive radiator, while another subsection type includes an active acoustic driver that would share the passive radiator in the first subsection type when a loudspeaker system is formed of subenclosures of the first and second types. The various types of subsections are combined and placed at appropriate locations in a room in order to provide the desired audio effect.

In another embodiment of this invention, a subenclosure includes low frequency, mid range, and high frequency audio drivers so that each subenclosure is complete in of itself and yet which can be combined with other like subenclosures for greater power requirements. The principles of this invention allow easy scaling of loudspeaker systems as desired and provide low cost manufacturing in that a number of similar units can be constructed and warehoused for final assembly as required regardless of whether the end use is to be a relatively small or a rather large loudspeaker system.

The invention now being fully described, it will be apparent to one of ordinary skill in the art that many changes and modifications can be made thereto without departing from the spirit or scope of the appended claims.

What is claimed is:

1. A multi-compound Isobarik loudspeaker system comprising:
   - a loudspeaker enclosure having a plurality of enclosure walls;
   - a single baffle mounted internal to said loudspeaker enclosure;
   - a first Isobarik hermetically sealed chamber having a first end and a second end, said first end mounted to a wall of said loudspeaker enclosure and said second end mounted to said single internal baffle in the interior of said loudspeaker enclosure;

a second Isobarik hermetically sealed chamber having a first end and a second end, said first end mounted to a wall of said loudspeaker enclosure and said second end mounted to said single internal baffle in the interior of said loudspeaker enclosure;

a first acoustical driver mounted at said first end of said first Isobarik hermetically sealed chamber;

a second acoustical driver mounted at said second end of said first Isobarik hermetically sealed chamber;

a third acoustical driver mounted at said first end of said second Isobarik hermetically sealed chamber; and a fourth acoustical driver mounted at said second end of said second Isobarik hermetically sealed chamber.

2. A loudspeaker system as in claim 1 which further comprises a low frequency port formed at one of said enclosure walls.

3. A loudspeaker system as in claim 2 wherein said port comprises a hole formed in said one of said enclosure walls or a passive radiator mounted at said one of said enclosure walls.

4. A loudspeaker system as in claim 1 wherein said hermetically sealed Isobarik chambers comprise cylindrical prisms.

5. A loudspeaker system as in claim 4 wherein each of said cylindrical prisms has a diameter of at least approximately 40% of its length.

6. A loudspeaker system as in claim 4 wherein the total volume of said cylindrical prisms is at least approximately 10% of the volume of said loudspeaker enclosure.

7. A loudspeaker system as in claim 1 which further comprises one or more cylindrical prisms or portions of cylindrical prisms mounted on the interior of one or more of said enclosure walls.

8. A loudspeaker system as in claim 1 wherein said first acoustical driver is located distant from said third acoustical driver.

9. A loudspeaker system as in claim 8 wherein said first acoustical driver is mounted on the same one of said enclosure walls as said third acoustical driver.

10. A loudspeaker system as in claim 9 wherein said first and said third acoustical drivers have similar frequency ranges.

11. A loudspeaker system as in claim 8 wherein said first and said third acoustical drivers have similar frequency ranges.

12. A loudspeaker system as in claim 1 wherein said single internal baffle has a height less than the internal height of said loudspeaker enclosure.

13. A loudspeaker system as in claim 12 which further comprises a port on one of said enclosure walls in proximity to the end of said single internal baffle, wherein the difference between said internal height of said loudspeaker enclosure and said height of said single baffle is selected to provide a desired magnitude of an acoustical output energy of said port.

14. A loudspeaker system as in claim 13 wherein said port comprises a hole formed in said one of said enclosure walls or a passive radiator mounted at said one of said enclosure walls.

15. A loudspeaker system as in claim 14 wherein said first and said third acoustical drivers have similar frequency ranges.

16. A loudspeaker system as in claim 1 wherein said single baffle has a width less than the internal width of said loudspeaker enclosure.

* * * * *